(12) United States Patent
Chu et al.

(10) Patent No.: US 10,497,628 B2
(45) Date of Patent: Dec. 3, 2019

(54) METHODS OF FORMING EPITAXIAL STRUCTURES IN FIN-LIKE FIELD EFFECT TRANSISTORS

(71) Applicant: Taiwan Semiconductor Manufacturing Co., Ltd., Hsin-Chu (TW)

(72) Inventors: Feng-Ching Chu, Pingtung County (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/939,647

(22) Filed: Mar. 29, 2018

(65) Prior Publication Data

US 2019/0157162 A1    May 23, 2019

Related U.S. Application Data

(60) Provisional application No. 62/589,664, filed on Nov. 22, 2017.

(51) Int. Cl.
| | | |
|---|---|---|
| *H01L 21/8238* | (2006.01) | |
| *H01L 27/088* | (2006.01) | |
| *H01L 29/06* | (2006.01) | |

(52) U.S. Cl.
CPC ........ *H01L 21/823814* (2013.01); *H01L 21/823821* (2013.01); *H01L 21/823878* (2013.01); *H01L 27/0886* (2013.01); *H01L 29/0649* (2013.01)

(58) Field of Classification Search
CPC ......... H01L 27/0924; H01L 21/823814; H01L 21/823878; H01L 21/823821; H01L 27/0886
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |

(Continued)

*Primary Examiner* — Thanh Y. Tran

(74) *Attorney, Agent, or Firm* — Haynes and Boone, LLP

(57) ABSTRACT

A method of fabricating a fin-like field effect transistor (FinFET) device includes providing a semiconductor substrate having a region for forming p-type metal-oxide-semiconductor (PMOS) devices and a region for forming n-type metal-oxide-semiconductor (PMOS) devices, forming fin structures in both regions of the substrate separated by isolation features, first forming source/drain (S/D) features in the PMOS region, and subsequently forming S/D features in the NMOS region. First forming the PMOS S/D features and then forming the NMOS S/D features results in a greater extent of loss of isolation features in the PMOS region than in the NMOS region.

20 Claims, 14 Drawing Sheets

(56) References Cited

U.S. PATENT DOCUMENTS

| | | | |
|---|---|---|---|
| 2017/0117411 A1* | 4/2017 | Kim | H01L 27/1104 |
| 2018/0102363 A1* | 4/2018 | Li | H01L 21/823892 |
| 2018/0254219 A1* | 9/2018 | Sun | H01L 21/823807 |
| 2019/0006465 A1* | 1/2019 | Liao | H01L 29/0847 |

* cited by examiner

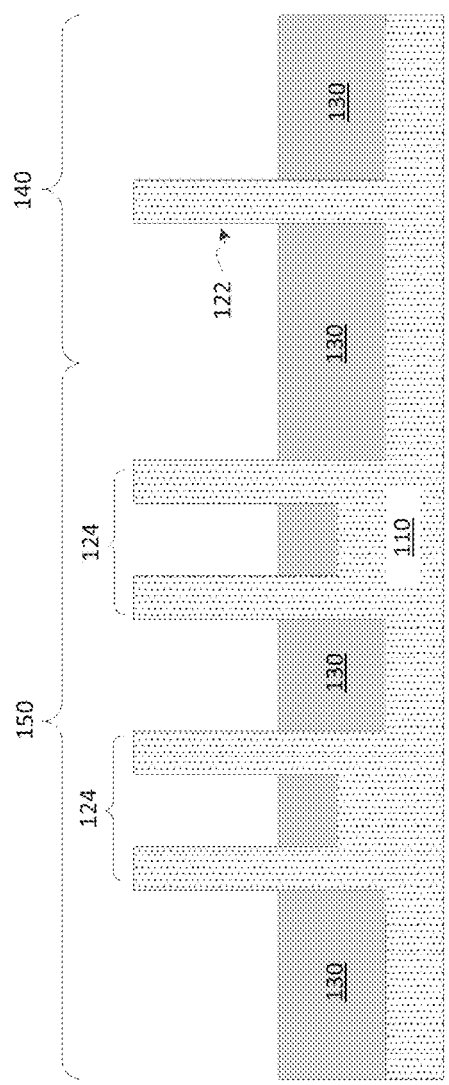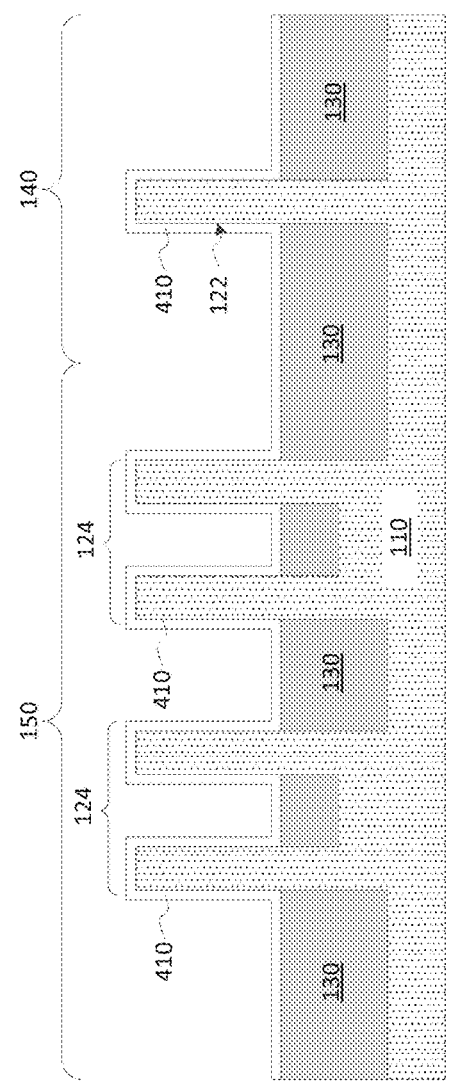

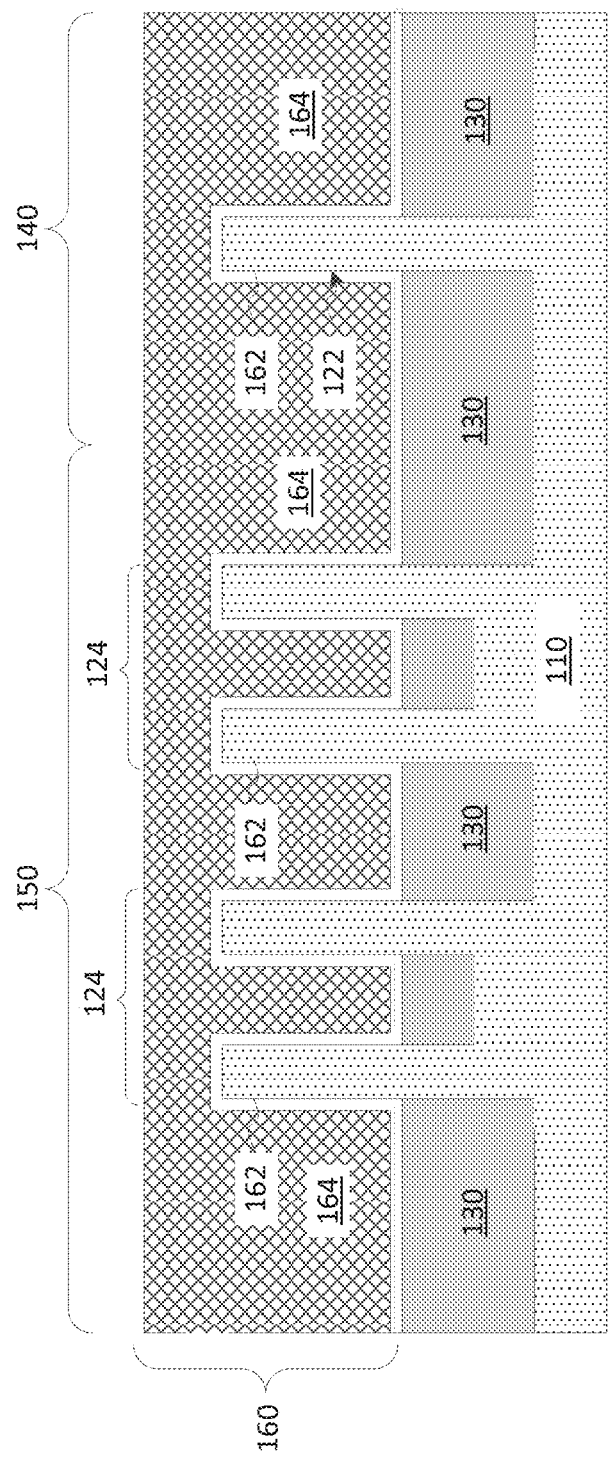

METHODS OF FORMING EPITAXIAL STRUCTURES IN FIN-LIKE FIELD EFFECT TRANSISTORS

PRIORITY

This application claims priority to U.S. Provisional Patent Application Ser. No. 62/589,664 filed on Nov. 22, 2017, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, planar transistors have been replaced by three-dimensional fin-like field effect transistors (FinFET) for which the n-type source/drain features and the p-type source/drain features are often formed in separate processes in an effort for improving device performance with decreased feature size. However, there are challenges associated with this fabrication method. In one example, due to structural differences between the n-type and p-type source/drain features, the sequence by which these features are formed may be improved upon to accommodate the fabrication of devices with reduced feature sizes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 6, 7, 8, 9, 10, 11, 12, 13, 14, 15, and 16 are fragmentary cross-sectional views of a FinFET device along line AA' as shown in FIG. 2 and according to various aspects of the present disclosure.

FIG. 5 is a fragmentary cross-sectional view of a semiconductor structure along line BB' as shown in FIG. 2 and according to various aspects of the present disclosure.

DETAILED DESCRIPTION

Figure 1A:
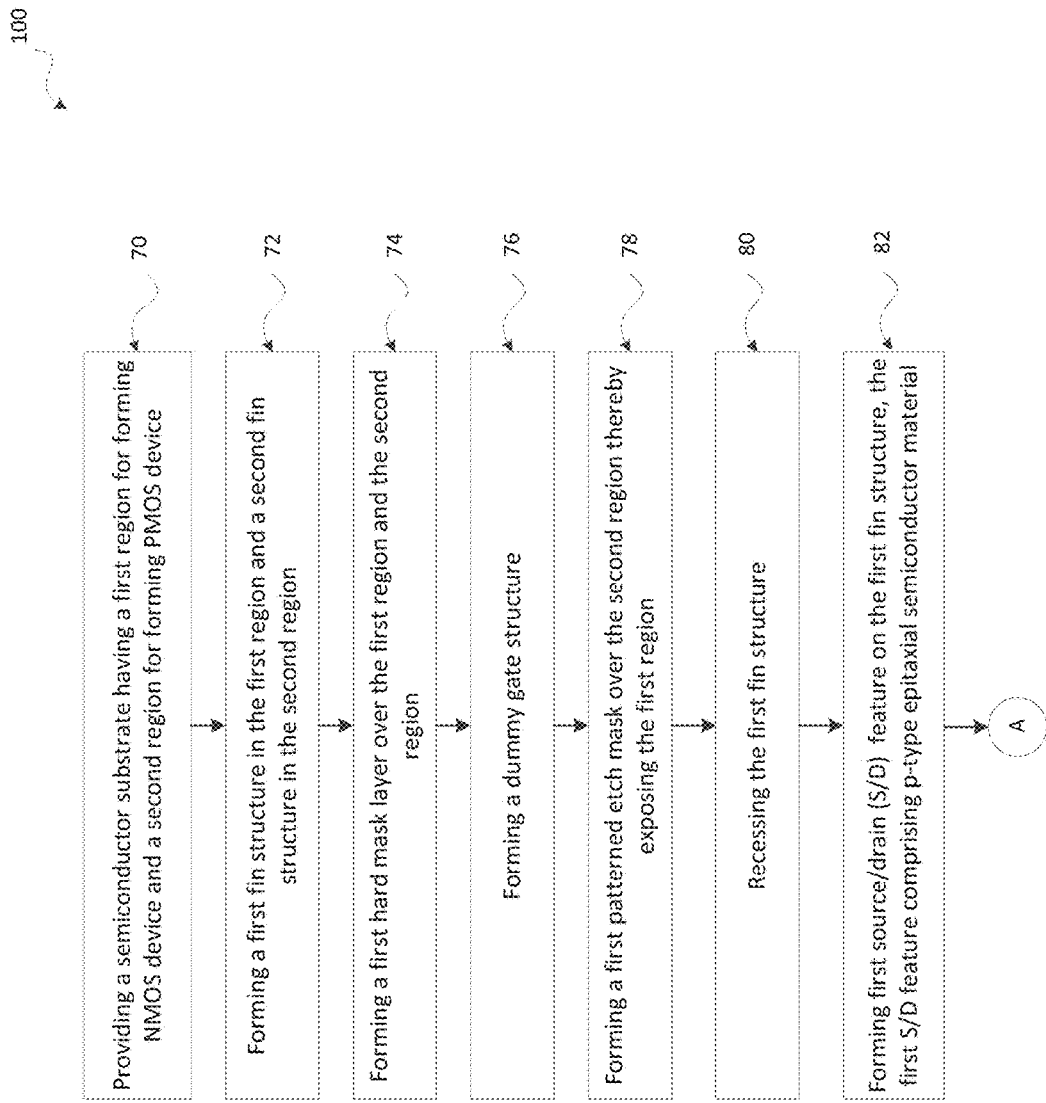
FIGS. 1A-1B illustrate a flowchart of an exemplary method for fabricating a semiconductor structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure relates generally to methods for fabricating semiconductor devices, and more particularly to methods of forming source/drain features in fin-like field effect transistor (FinFET) devices. The FinFET devices, for example, may be complementary metal-oxide-semiconductor (CMOS) devices comprising a p-type metal-oxide-semiconductor (PMOS) FinFET device and an n-type metal-oxide-semiconductor (NMOS) FinFET device. In fabricating CMOS FinFET devices comprising both NMOS and PMOS devices, source/drain (S/D) features of the NMOS device are oftentimes formed separately from S/D features of the PMOS device. In particular, the S/D features of the NMOS device are usually formed first, followed by the formation of the S/D features of the PMOS device. This may be accomplished by first protecting (by, for example, a photoresist layer) the region of the FinFET providing the PMOS device, and then recessing the fins in the region of the FinFET providing the NMOS device before forming the NMOS S/D features on the recessed fins. Thereafter, the NMOS S/D features are similarly protected to accommodate the formation of the PMOS S/D features. However, because the NMOS S/D features differ from the PMOS S/D features in many respects, forming the NMOS S/D features before forming the PMOS S/D features poses challenges in subsequent processes. For example, the NMOS S/D features generally have larger size (e.g., features merging multiple fins) and structural variations than the PMOS S/D features; thus, forming the NMOS S/D features first leaves a small processing window for the subsequent fabrication of the PMOS S/D features, which may cause poor feature uniformity, potential photolithography misalignment, and/or other adverse effects. Accordingly, the present disclosure contemplates methods of forming PMOS S/D features before forming NMOS S/D features in order to enlarge the overall process window.

Figure 1B:
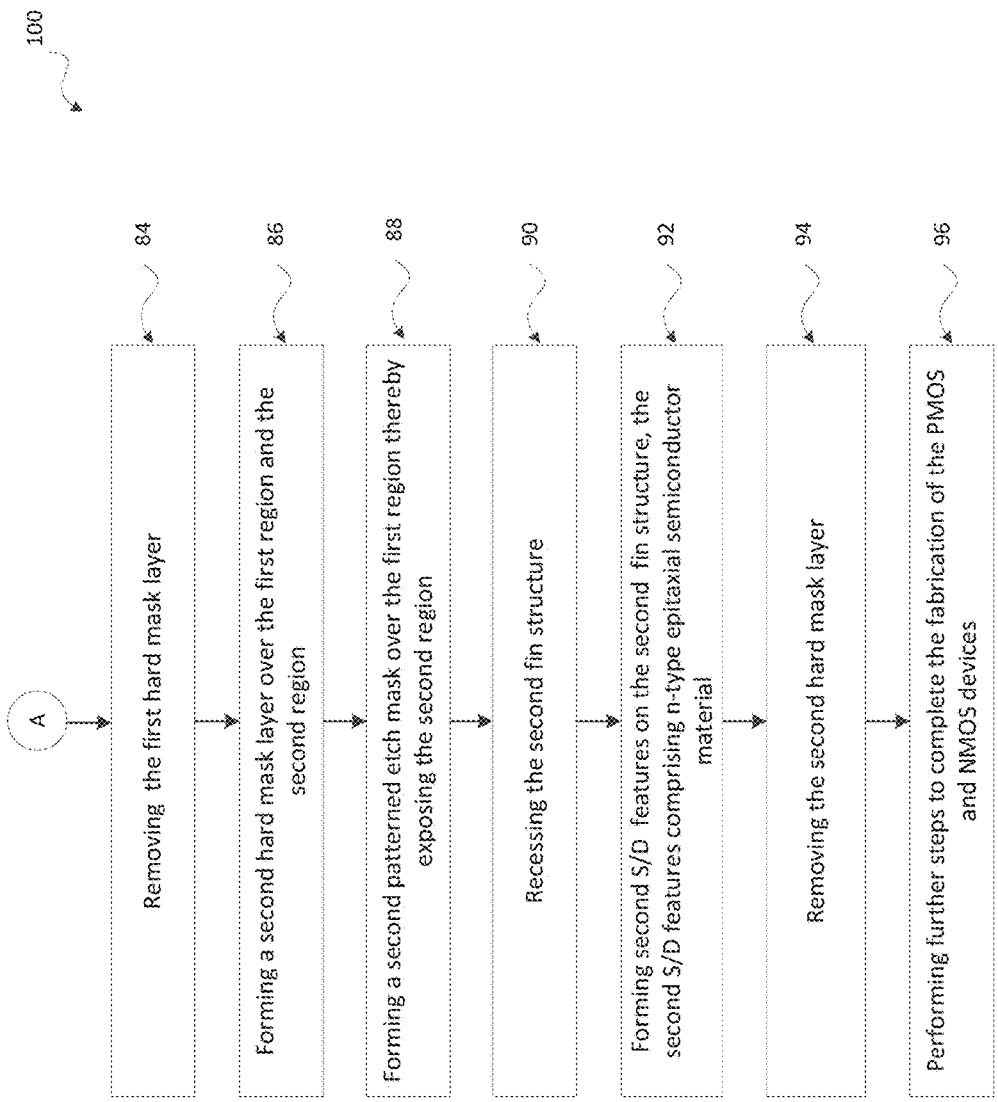
Figure 2:
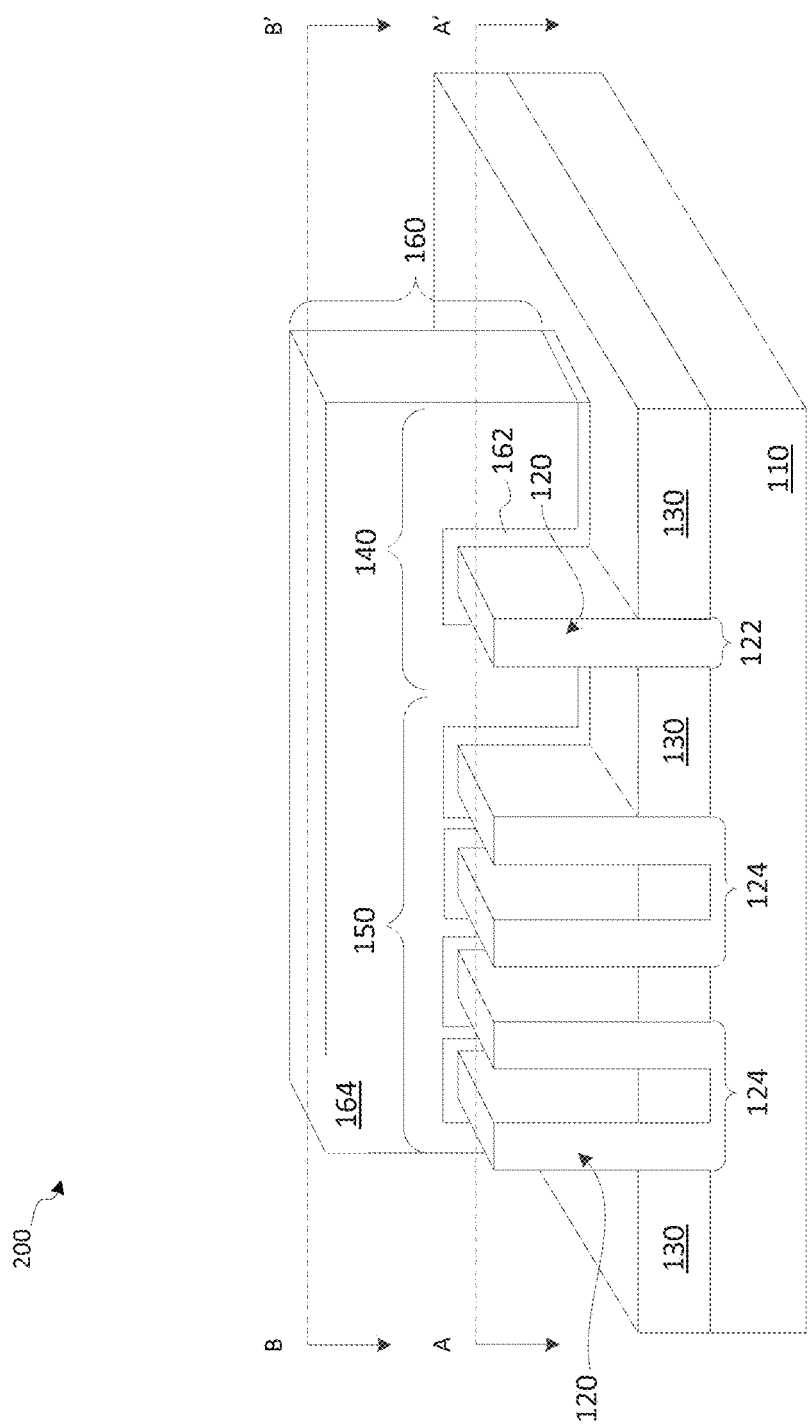
FIG. 2 is a perspective, three-dimensional views of the semiconductor structure according to various aspects of the present disclosure.

FIGS. 1A-1B illustrate a flowchart of method 100 for fabricating FinFET devices in an exemplary semiconductor structure according to some aspects of the present disclosure. A portion of the exemplary semiconductor structure 200 according to aspects of the present disclosure is depicted in FIG. 2 to aid the discussion of the various steps of method 100. The semiconductor structure 200, as shown in FIG. 2, includes a semiconductor substrate 110, a plurality of fins 120 (or alternatively, "active regions") disposed in a first region 140 and a second region 150 of the semiconductor substrate 110 and separated by isolation features 130, a dummy gate structure 160 that includes various materials layers such as, for example, a dummy gate dielectric layer 162 and a dummy gate electrode layer 164. Additional devices and features, though not shown, may also be present in the semiconductor structure 200 and any variations thereof according to aspects of the present disclosure.

The method 100 is described with respect to cross-sectional views of the semiconductor 200 in a source/drain (S/D) region taken along direction AA' (FIGS. 3, 4, and 6-16) and in a channel region taken along direction BB' (FIG. 5). Various aspects of the present disclosure provide that the channel region and the S/D region of the semiconductor structure 200 undergo substantially similar processes during operations 70 and 72, and the channel region remains largely unaffected during operations 76-94 applied to the S/D region. Accordingly, a portion of the cross-sectional view along the direction BB' of the channel region is only depicted in FIG. 5. Additional steps can be provided before, during, and after the method 100, and some of the steps described can be replaced, eliminated, or moved around for additional embodiments of the method 100.

At operation 70, the method 100 (FIG. 1A) provides a semiconductor substrate 110. The substrate 110 includes an elementary semiconductor having a crystalline structure, such as silicon. Alternatively or additionally, the substrate 110 includes another elementary semiconductor, such as germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium phosphide, aluminum gallium arsenide, gallium indium arenside, gallium indium phosphide, and gallium indium arsenide phosphide; or combinations thereof. Alternatively, the substrate 110 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 110 may further include features such as a buried layer, and/or an epitaxial semiconductor layer grown in its upper portion. In the depicted embodiments, the substrate 110 includes a first region 140 (a PMOS region) and a second region 150 (an NMOS region).

In some embodiments, additional material layers (not shown) such as a hard mask layer and a resist layer are formed over the substrate 110 during step 70 to facilitate subsequent steps of method 100 to form fins 120. In some embodiments, the hard mask layer may include any suitable material, such as silicon oxide, silicon nitride, silicon carbide, silicon oxycarbide, silicon oxynitride, spin-on glass (SOG), a low-k dielectric material, tetraethylorthosilicate (TEOS), or other suitable materials, and may be formed by a suitable method, such as thermal oxidation, chemical vapor deposition (CVD), physical vapor deposition (PVD), atomic-layer deposition (ALD), other suitable methods, or a combination thereof. The resist layer may include, for example, a photosensitive material that causes the resist layer to undergo changes in chemical properties when exposed to light. The resist layer can be formed by a process such as spin coating over the hard mask layer. The method 100 may use a series of photolithography and etching processes to pattern the hard mask layer to form fins 120 over the substrate 110 as discussed in detail below.

At operation 72, the method 100 (FIG. 1A) forms fins 120 in the first region 140 and the second region 150. As illustrated in FIG. 3, the fins 120 are formed over the substrate 110 and separated by isolation features 130. In some embodiments, forming the fins 120 also leads to the formation of isolation features 130. In some embodiments, the isolation features 130 include, for example, silicon oxide, silicon nitride, silicon oxynitride, fluorine-doped silicate glass (FSG), a low-k dielectric material, other suitable dielectric materials, or combinations thereof. The isolation features 130 can include different structures such as shallow trench isolation (STI) structures, deep trench isolation (DTI) structures, and/or local oxidation of silicon (LOCOS) structures.

The fins 120 and the isolation features 130 can be formed by any suitable process. In an exemplary embodiment, the process can include the following steps: one or more processes for patterning the hard mask layer discussed above (e.g., by using the patterned resist layer discussed above) over the substrate 110, an etching process (e.g., a dry etching and/or wet etching process) to etch trenches in the substrate 110 not covered by the patterned hard mask layer, and a deposition process (e.g., a chemical vapor deposition process and/or a spin-on glass process) to fill in the trenches with one or more insulating materials to form the isolation features 130. The trenches may be partially filled, where the substrate remaining between trenches forms the fins 120. The hard mark layer may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 110 and patterned using a photolithography process. Spacers are formed alongside the patterned sacrificial layer using a self-aligned process. The sacrificial layer is then removed, and the remaining spacers, or mandrels, become the patterned hard mask layer. Following the formation of the fins 120, the hard mask layer and the resist layer are removed.

Alternative to partially filling the trenches with the insulating material, operation 72 may completely fill the trenches with the insulating material, planarize a top surface of the filled trenches to remove any excessive insulating material using, for example, a polishing process such as chemical mechanical polishing/planarization (CMP), and selectively grow one or more layers of epitaxial semiconductor materials over the exposed substrate 110 thereby forming the fins 120 with isolation features 130 disposed in between the fins 120. The epitaxial semiconductor material can be silicon, germanium, silicon germanium, other suitable materials, or combinations thereof. Accordingly, the fins 120 formed by embodiments provided herein may comprise the same material as the substrate 110 or, alternatively, they may comprise one or more layers of epitaxially grown semiconductor materials over the substrate 110. In the depicted embodiments, the fins 120 comprise the same material as the substrate 110.

At operation 74, the method 100 (FIG. 1A) forms a first hard mask layer 410 over the fins 120 (i.e., the first fin structure 122 and the second fin structures 124) and the isolation features 130 in both the first region 140 and the second region 150, as shown in FIG. 4. The first hard mask layer 410 acts as a barrier between the fins 120 and the subsequently formed patterned etch mask 610 (FIG. 6) to avoid contaminating the fins 120. In some embodiments, the hard mask layer 410 includes any suitable material, such as silicon oxide, silicon nitride, silicon carbide, silicon oxycarbide, silicon oxynitride, SOG, a low-k dielectric material, TEOS, or other suitable materials, and may be formed by a suitable method, such as thermal oxidation, CVD, PVD, ALD, other suitable methods, or a combination thereof.

In the depicted embodiments, the first fin structure 122 comprising one fin 120 forms PMOS FinFET devices and the second fin structure 124 each comprising two fins connected at the bottom forms NMOS FinFET devices. As such, the first region 140 is hereafter referred to as the "PMOS region" and the second region 150 is hereafter referred to as the "NMOS region." Although the depicted embodiments of FIG. 3 and the subsequent figures show four fins 120 disposed in the NMOS region 150 and one fin 120 in the PMOS region 140, embodiments of the present disclosure are not limited to this configuration. For example, there may be two fins formed in the NMOS region 140 rather than four fins as depicted herein.

At operation 76, the method 100 (FIG. 1A) forms a dummy gate structure 160 over the isolation features 130 and engaging the fins 120 as depicted in FIG. 5. In some embodiments, additional dummy gate structures may be formed separately in the PMOS region 140 and the NMOS region 150. FIG. 5 illustrates a cross-sectional view of the channel region of the dummy gate structure 160 taken along the direction BB' as shown in FIG. 2. As depicted herein, the dummy gate structure 160 includes a dummy gate dielectric layer 162 and a dummy gate electrode layer 164 comprising polysilicon. In various embodiments, the dummy gate structure 160 may include additional layers such as interfacial layers, capping layers, diffusion and/or barrier layers, dielectric layers, conductive layers, other suitable layers, and/or combinations thereof. The dummy gate structure 160 may be formed by deposition and etching processes.

In some embodiments, gate spacers (i.e., sidewall spacers; not shown) are formed on each side of the dummy gate structure 160. The gate spacers may comprise a dielectric material, such as silicon oxide, silicon nitride, silicon oxynitride, silicon carbide, other dielectric material, or combinations thereof, and my comprise one or multiple layers of material. The gate spacers may be formed by depositing a spacer material as a blanket over the isolation features 130, the fins 120, and the dummy gate structure 160. Subsequently, the spacer material is etched back anisotropically during an etching process. Portions of the spacer material on the sidewalls of the dummy gate structures remain and form the gate spacers (not shown).

In the depicted embodiments, portions of the dummy gate structure 160 are subjected to a high-k metal gate (HK MG) replacement process after high thermal budget processes are performed. In some embodiments, the dummy gate electrode 164 is replaced with a plurality of metal layers to form a conductive electrode, while the dummy gate dielectric layer 162 is replaced with a high-k gate dielectric layer.

Figure 6:
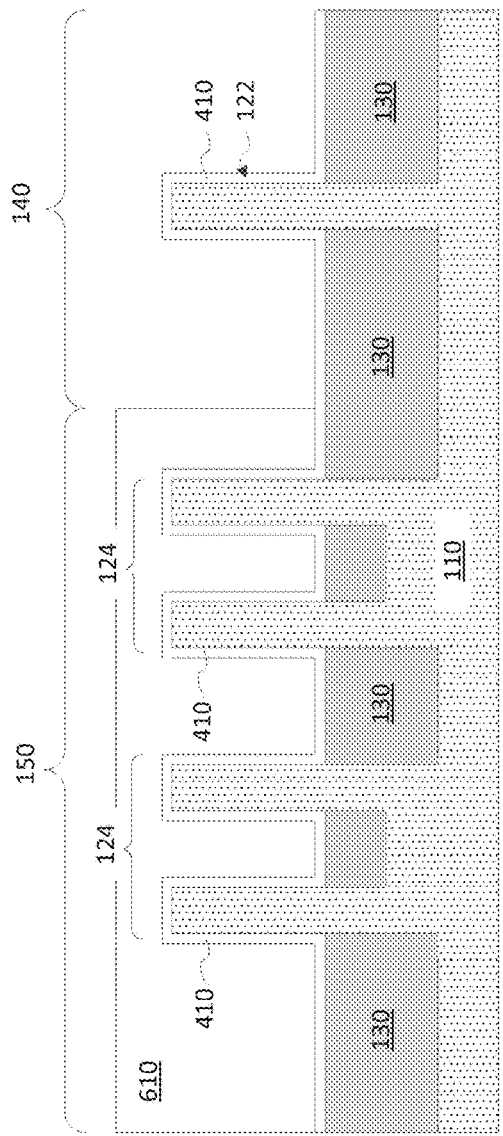

At operation 78, as depicted in FIG. 6, the method 100 (FIG. 1A) forms a patterned etch mask 610 over the first hard mask layer 410 and the isolation features 130 in the NMOS region 150, thereby exposing the PMOS region 140 to subsequent fabrication processes. In an embodiment, the patterned etch mask 610 includes a patterned resist layer. The resist layer may include, for example, a photosensitive material that causes the resist layer to undergo changes in chemical properties when exposed to light. The resist layer can be formed by a process such as spin coating over the first hard mask layer 410.

Thereafter, at operation 80, the method 100 (FIG. 1A) recesses a portion 710 of the first fin structure 122 in the PMOS region 140 while the patterned etch mask 610 covers the NMOS region 150. The recessing process may include a dry etching process, a wet etching process, other suitable etching process, or combinations thereof. In some embodiments, a reactive ion etching (RIE) process is performed. In the depicted embodiments, a dry etching process is implemented to recess the fin 120. After recessing the fin 120, the patterned etch mask 610 is removed from the PMOS region 140.

In some embodiments, the dry etching process is implemented to remove the portion 710 of the first fin structure 122 in the PMOS region 140. The dry etching process may utilize one or more etchant comprising fluorine, bromine, sulfur, carbon, oxygen, and/or hydrogen atoms. In some embodiments, the dry etching process implements a mixture of etchant gasses comprising $CF_4$, $SF_6$, $CH_2F_2$, $CHF_3$, $C_2F_6$, Br, and/or $O_2$. In some embodiments, a bias voltage is applied during the dry etching process to increase the anisotropy of the dry etching process.

Figure 7:
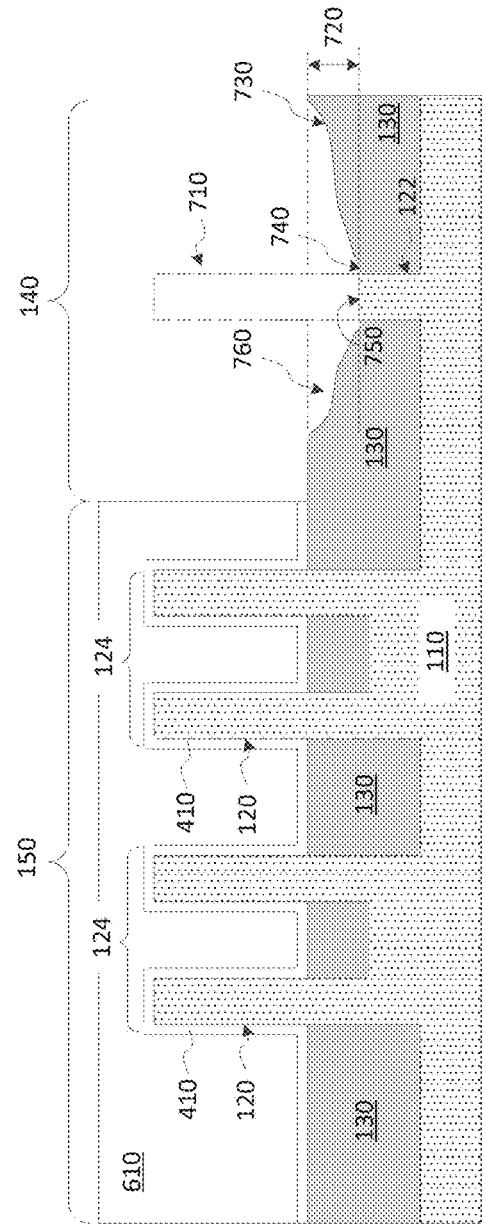

As depicted in FIG. 7, recessing the first fin structure 122 in the PMOS region 140 also removes portions of the isolation features 130 in the vicinity of the first fin structure 122 and forms a recessed region 730A and a recessed region 730B in the isolation features 130 on each side of the S/D feature 810. In some embodiments, the recessed region 730A is defined by a vertical distance 720 between a top surface 760 of the isolation features 130 prior to the recessing process and the lowest point 740 of the isolation features 130 in the recessed region 730A. In some embodiments, the lowest point 740 of the isolation feature 130 (i.e., the lowest point of the recessed region 730A) is adjacent to an interface between the lowest point of the S/D feature 810 and a top surface of the recessed first fin structure 122. In some embodiments, the lowest point 740 is at about the same height as a top surface 750 of the recessed first fin structure 122 in the PMOS region 140. Thereafter, the method 100 removes the patterned etch mask 610 by any suitable method.

Figure 8:
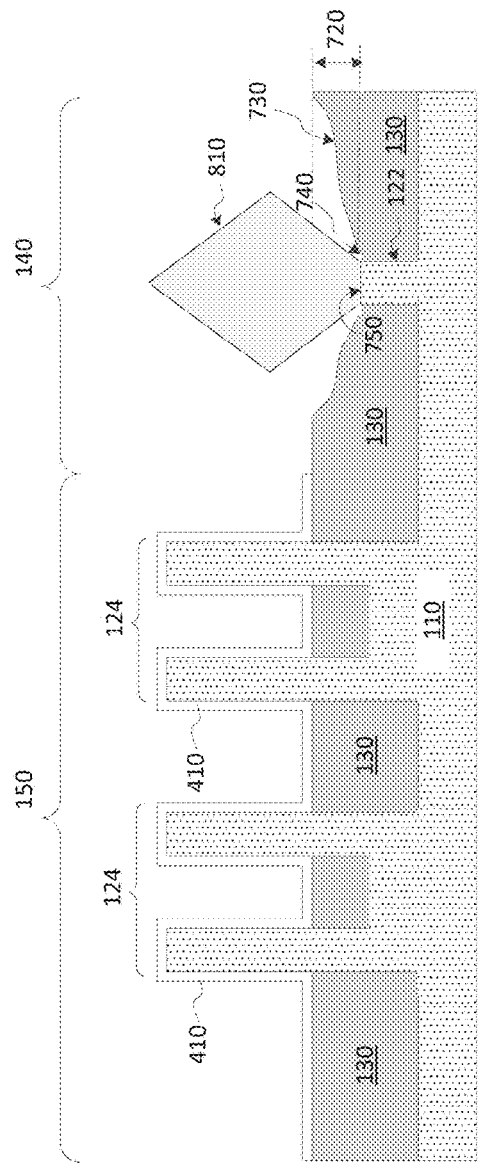

At operation 82, the method 100 forms S/D features in the PMOS region 140 as illustrated in FIG. 8. In the depicted embodiment, the S/D feature 810 is formed by epitaxially growing a semiconductor material on the top surface of the recessed first fin structure 122. The S/D feature 810 may include a suitable epitaxial semiconductor material, such as germanium (Ge), silicon (Si), gallium arsenide (GaAs), aluminum gallium arsenide (AlGaAs), silicon germanium (SiGe), gallium arsenide phosphide (GaAsP), other suitable materials, or combinations thereof. In some embodiments, the S/D feature 810 may include one or more layers of epitaxially grown semiconductor materials. The S/D feature 810 may be formed by any suitable deposition process such as selective epitaxy growth (SEG) or cyclic deposition and etching (CDE) epitaxy.

In some embodiments, the S/D feature 810 may include various dopants. In the depicted embodiment where a PMOS FinFET device is desired in the first region 140, the S/D feature 810 may include one or more epitaxial layers of silicon germanium doped with a p-type dopant such as boron, germanium, indium, other p-type dopant, or combinations thereof. Any suitable process (e.g., an ion implantation process, a diffusion process, an in-situ doping process, or combinations thereof) can be implemented for doping the S/D feature 810. One or more annealing processes (e.g., rapid thermal annealing or laser annealing) may be performed to activate the epitaxial structure.

Figure 9:
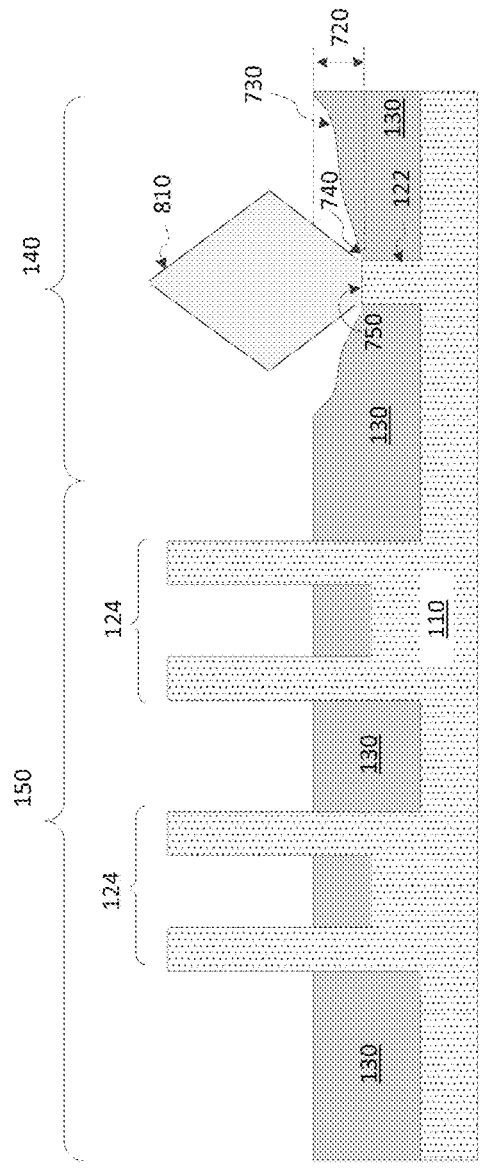
Figure 10:
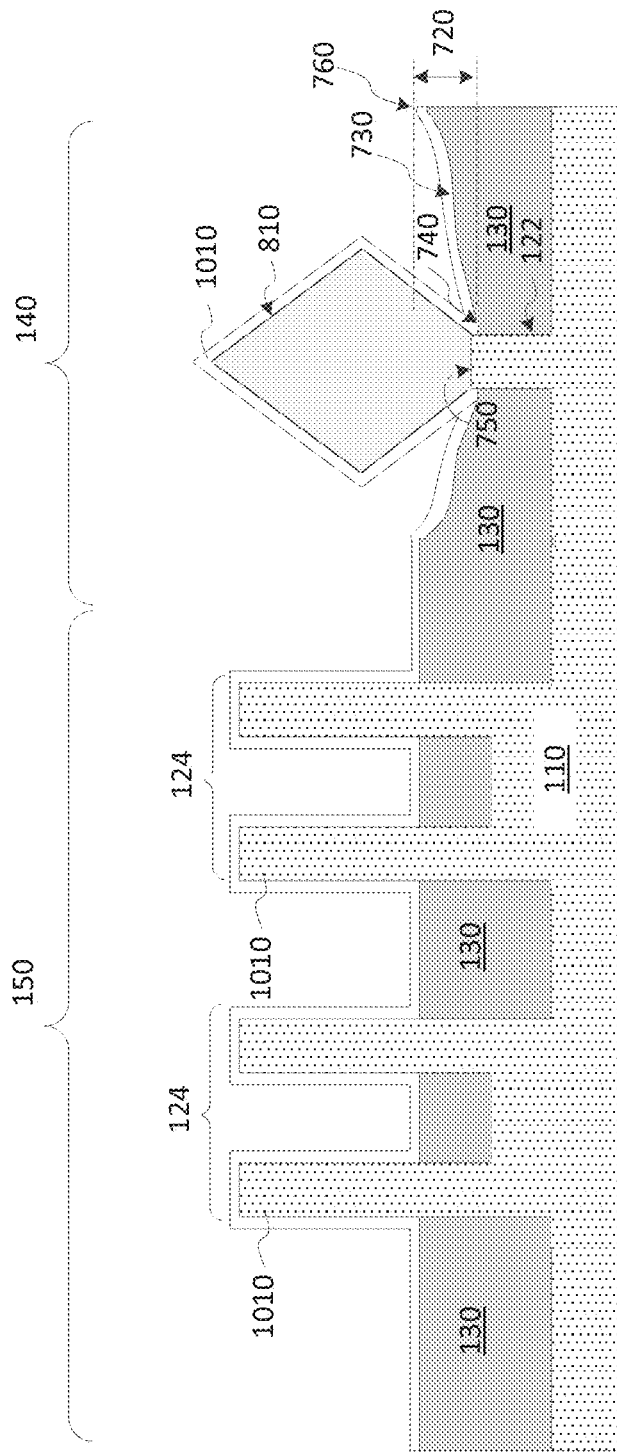
Figure 11:
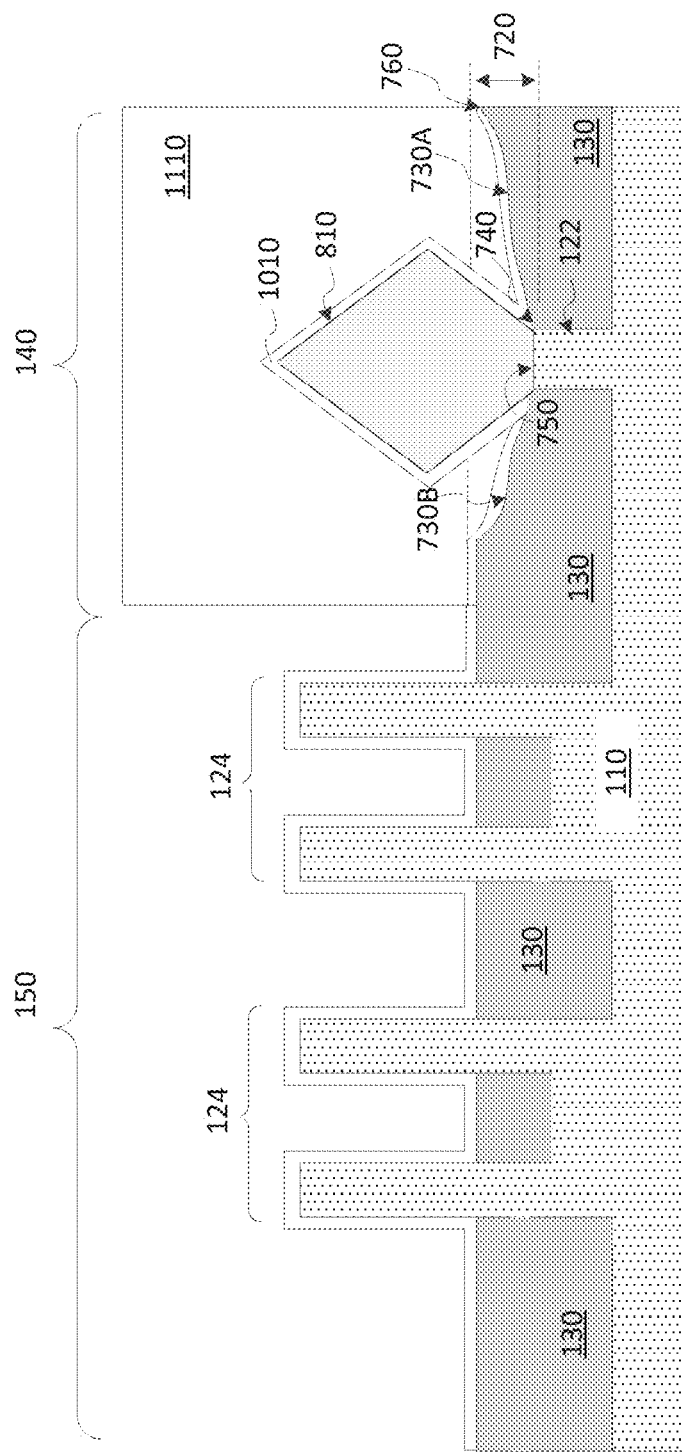

At operation 84, the method 100 (FIG. 1B) removes the remaining first hard mask layer 410 deposited over the NMOS region 150, as depicted in FIG. 9. In some embodiments, the first hard mask layer 410 can be removed by any suitable process or processes such as, for example, by dry etch selective to the materials of the first hard mask layer 410. Subsequently, at operation 84, the method 100 (FIG. 1B) forms a second hard mask 1010 over the various features disposed in both the NMOS region 150 and the PMOS region 140, as depicted in FIG. 10. Similar to the discussion above for the operation 74, the second hard mask layer 1010 acts as a barrier material to protect the fins 120 from being contaminated by a second patterned etch mask 1110 (FIG. 11). Thereafter, at operation 88, the method 100 (FIG. 1B) forms the second patterned etch mask 1110 over the PMOS region 140, which includes the S/D feature 810 and the isolation features 130 surrounding the first fin structure 122, as depicted in FIG. 11. In some embodiments, the second patterned etch mask 1110 may comprise the same material as that of the first patterned etch mask 610.

After forming the PMOS S/D feature 810, the method 100 proceeds to form the NMOS S/D features in the ensuing processing steps. As noted above, the NMOS S/D features generally have larger size (e.g., features merging multiple fins) and greater structural variations (i.e., less uniform epitaxial structures) than the PMOS S/D features. In one example, statistical variations in the sizes of NMOS S/D features are approximately 1.5 to 2 times those of the PMOS S/D features. As a result, forming the NMOS S/D features before forming the PMOS S/D features generally leaves a narrow processing window for the overall fabrication process. In one such example, a narrow processing window may lead to less tolerance for misalignment that may occur during subsequent lithographical, etching, and/or deposition processes. In comparison, the present disclosure provides methods of forming the PMOS S/D features before forming the NMOS S/D features in an effort to enlarge the processing window for the overall fabrication process.

Figure 12:
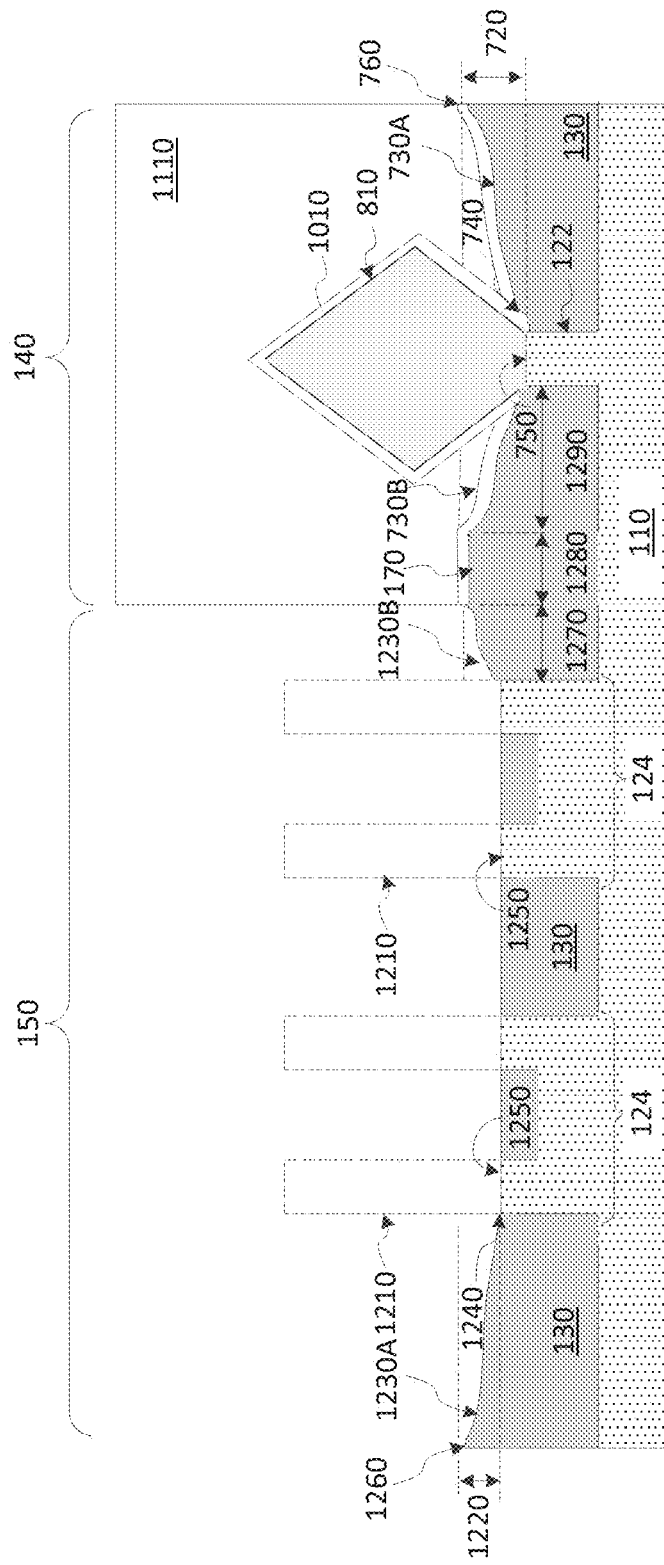

At operation 90, the method 100 (FIG. 1B) recesses a portion 1210 of the second fin structures 124 in the NMOS region 150 while the second patterned etch mask 1110 covers the PMOS region 140, as depicted in FIG. 12. The recessing can be implemented by any suitable process or processes including, for example, a dry etching process, a wet etching process, an RIE process, other suitable etching process, and/or combinations thereof. Similar to the embodiments discussed with respect to the recessing of the first fin structure 122 in the PMOS region 140, a dry etching process is implemented to recess the second fin structures 124 in the NMOS region 150. Thereafter, the method 100 removes the patterned etch mask 1110 by any suitable method.

Similar to the operation 80, the dry etching process may utilize one or more etchant comprising fluorine, bromine, sulfur, carbon, oxygen, and/or hydrogen atoms. In some embodiments, the dry etching process implements a mixture of etchant gasses comprising $CF_4$, $SF_6$, $CH_2F_2$, $CHF_3$, $C_2F_6$, Br, and/or $O_2$.

As depicted in FIG. 12, recessing the second fin structures 124 in the NMOS region 150 also removes portions of the isolation features 130 in the vicinity of the second fin structures 124, resulting in a recessed region 1230A and a recessed region 1230B in the isolation features 130. In some embodiments, the recessed region 1230A is defined by a vertical distance 1220 between a top surface 1260 of the isolation features 130 prior to the recessing process and the lowest point 1240 in the recessed region 1230A. It is understood that the top surface 1260 in the NMOS region 150 is approximately at the same position as the top surface 760 in the PMOS region 140, and are the two highest points of the isolation features 130. In some embodiments, the lowest point 1240 is at about the same height as a top surface 1250 of the recessed second fin structures 124 in the NMOS region 150. In the depicted embodiments, the vertical distance 1220 in the NMOS region 150 is less than the vertical distance 720 in the PMOS region 140, i.e., the extent of loss in the isolation features 130 incurred by the recessing process is less in the NMOS region 150 than in the PMOS region 140 when the source/drain feature 810 is formed prior to the source/drain feature 1310. This may be caused by the fact that the isolation features 130 of the PMOS region 140 are exposed to a greater amount of etchant when the first fin structure 122, which includes a single fin, is recessed than the isolation features 130 of the NMOS region 150 when the second fin structures 124, which each includes two connected fins, are recessed. In some embodiments, a ratio between the vertical distance 1220 and the vertical distance 720 is from about 1:2 to about 2:3. Furthermore, a top surface 1250 of the recessed second fin structure 124 in the NMOS region 150 is above a top surface 750 of the recessed first fin structure 122 in the PMOS region 140.

Still referring to FIG. 12, the isolation feature 130 between the S/D feature 810 and the S/D feature 1310 includes the recessed region 730B, the recessed region 1230B, and an island 170. The recessed region 730B may be defined by a lateral distance 1290, the recessed region 1230B may be defined by a lateral distance 1270, and the island 170 may be defined by a lateral distance 1280. In the depicted embodiment, the island 170 is disposed between the recessed profile 1230B and the recessed profile 730B.

Similar to the discussion above regarding the vertical distance 1220 and the vertical distance 720, the lateral distance of each of the recessed profiles also reflects the extent of loss of the isolation feature 130 caused by the recessing of the fin structures 122 and 124. In the depicted embodiment, the relative magnitude of the lateral distance 1270, the lateral distance 1290, and the lateral distance 1280 is affected by the order in which the S/D feature 1310 and the S/D feature 810 are formed. Specifically, because the S/D feature 1310 is larger in size and exhibits less uniformity than the S/D feature 810, forming the S/D feature 1310 (e.g., recessing the second fin structure 124) prior to forming the S/D feature 810 (e.g., recessing the first fin structure 122) may leave a smaller processing window (i.e., the lateral distance 1290<the lateral distance 1270) and thus less tolerance for potential misalignment (e.g., lithographic overlay errors) that may occur when forming the S/D feature 810. The present disclosure provides embodiments in which the S/D feature 810 is formed prior to forming the S/D feature 1310, enlarging the processing window for forming the S/D feature 810 (i.e., the lateral distance 1290>the lateral distance 1270) and providing enhanced control over the subsequent recessing of the second fin structure 124 to form the S/D feature 1310. In many embodiments, the lateral distance 1290 is greater than the distance 1270. In an exemplary embodiment, a ratio of the lateral distance 1270 to the lateral distance 1290 is from about 1:5 to about 3:5, and a ratio of the lateral distance 1280 to the lateral distance 1290 is less than about 1:3. In some instances, the lateral distance 1280 may be 0.

Figure 13:
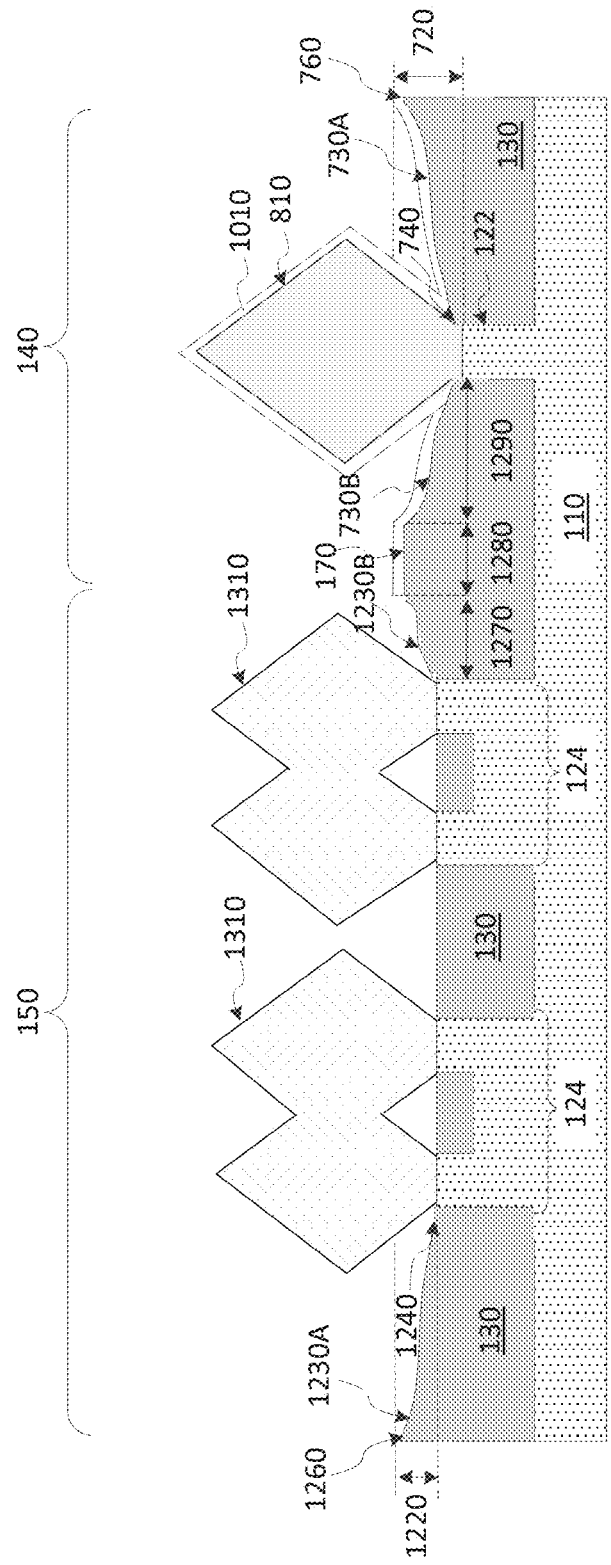

At operation 92, the method 100 (FIG. 1B) forms S/D features 1310 in the NMOS region 150 as illustrated in FIG. 13. The process of forming epitaxially grown S/D features 1310 in the NMOS region 150 is similar to that of the S/D feature 810 formed in the PMOS region 140, though the various semiconductor materials, dopants, and the final configuration of the epitaxial features 1310 may differ from that that of the feature 810 formed in the PMOS region 140. In some embodiments, the NMOS S/D features 1310 merge together the two adjacent fins 120 of the second fin structure 124. Thus, the size of the S/D features 1310 are generally greater than the size of the PMOS S/D feature 810, which is epitaxially formed over a single fin 120 (i.e., the first fin structure 122) in the PMOS region 140.

Similar to the S/D feature 810, the S/D features 1310 may include germanium (Ge), silicon (Si), gallium arsenide (GaAs), aluminum gallium arsenide (AlGaAs), silicon germanium (SiGe), gallium arsenide phosphide (GaAsP), other suitable materials, or combinations thereof. In some embodiments, the S/D features 1310 may include one or more layers of epitaxially grown semiconductor materials. The S/D feature 1310 may be formed by any suitable deposition process such as selective epitaxy growth (SEG) or cyclic deposition and etching (CDE) epitaxy. Different from the S/D feature 810, in the depicted embodiment where an NMOS FinFET device is desired, the S/D features 1310 may include one or more epitaxial layers of silicon or silicon carbon, where the silicon or silicon carbon is doped with an n-type dopant such as arsenic, phosphorus, other n-type dopants, or combinations thereof. Any suitable process similar to the doping, activating, and annealing of the S/D feature 810 as discussed above can be implemented for the S/D features 1310.

Figure 14:
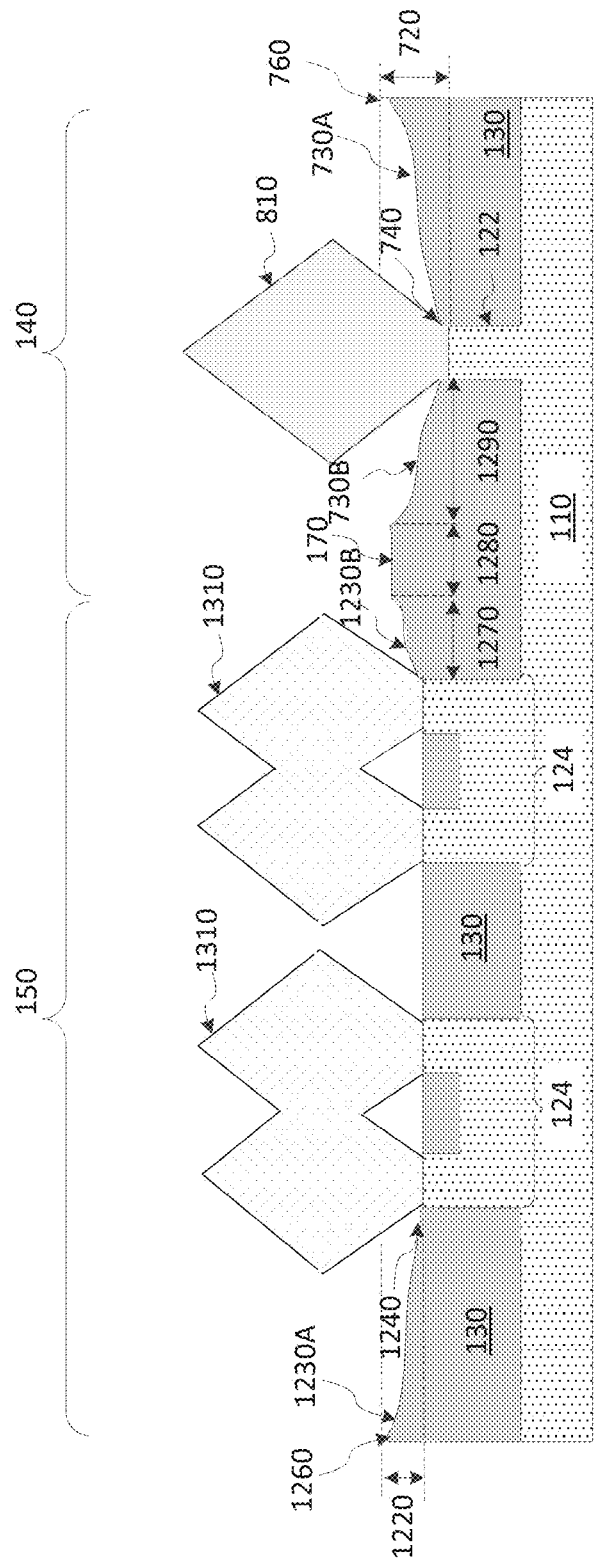

Thereafter, at operation 94, the method 100 (FIG. 1B) removes the remaining second hard mask layer 1010 from the PMOS region 140, as illustrated in FIG. 14. In some embodiments, the second hard mask layer 1010 can be removed by any suitable process or processes such as, for example, by dry etch. Accordingly, the method 100 completes the formation of the PMOS S/D features 810 followed by the formation of the NMOS S/D features 1310.

Figure 15:
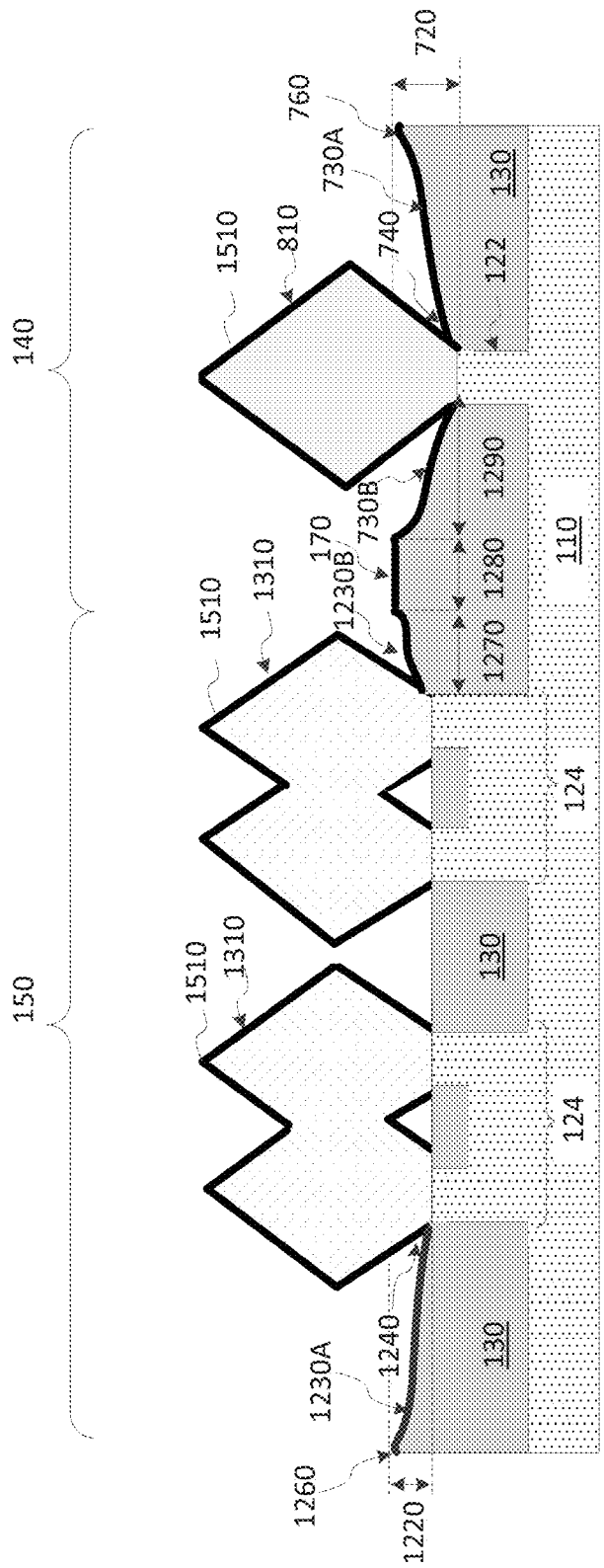

At operation 96, the method 100 (FIG. 1B) performs further steps to complete the fabrication of the PMOS and NMOS devices in the semiconductor structure 200. For example, as illustrated in FIG. 15, the operation 96 deposits a contact etch-stop layer (CESL) 1510 conformally over the features of the PMOS region 140 and the NMOS region 150. The CESL 1510 may comprise silicon nitride, silicon oxynitride, silicon nitride with oxygen (O) or carbon (C) elements, and/or other materials, and may be formed by CVD, PVD, ALD, or other suitable methods.

Figure 16:
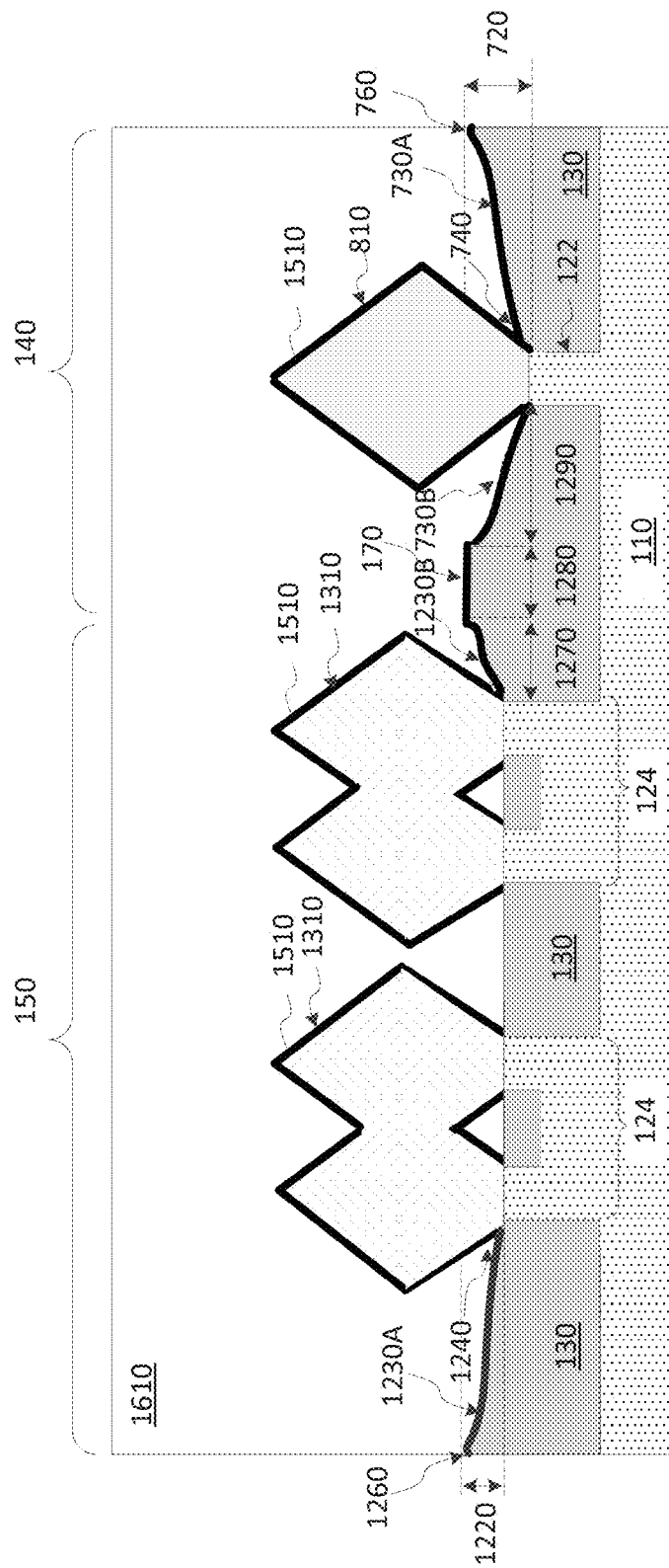

Subsequently, the operation 96 forms an interlayer dielectric (ILD) layer 1610 over the features of the PMOS region 140 and the NMOS region 150, as depicted in FIG. 16. The ILD layer 1610 may include TEOS, un-doped silicate glass, or doped silicon oxide such as borophosphoslicate glass (BPSG), fused silica glass (FSG), phosphosilicate glass (PSG), boron-doped silicate glass (BSG), and/or other suitable dielectric materials. In some implementations, the ILD layer 1610 can include a multilayer structure having multiple dielectric materials. The ILD layer 1610 may be formed by plasma-enhanced CVD (PECVD), flowable CVD (FCVD), or other suitable methods. The operation 96 then performs one or more planarization processes, such as chemical-mechanical planarization/polishing (CMP) processes, to planarize the top surface of the semiconductor structure 200.

The operation 96 further includes removing the dummy gate structure 160 to form a gate trench (not shown) and subsequently form a high-k metal gate structure (HK MG structure; not shown) in the gate trench. The HK MG structure includes a high-k gate dielectric layer and a conductive gate electrode layer, as well as additional material layers such as interfacial layers, capping layers, diffusion layers, barrier layers, or combinations thereof. The high-k gate dielectric layer may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k gate dielectric layer may be deposited using CVD, ALD and/or other suitable methods. The conductive gate electrode layer may include one or more metal layers, such as work function metal (WFM) layer(s), conductive barrier layer(s), and bulk conductive layer(s). The WFM layer may be a p-type or an n-type work function layer depending on the type of the device (PMOS or NMOS), and may be, for example, TaN, NiSi, CoSi, TiN, WN, TiAl, TiAlN, TaCN, TaC, TaSiN, TaAl, TaAlC, TaN, $ZrSi_2$, $MoSi_2$, $TaSi_2$, $NiSi_2$, WN, other WFM, or combinations thereof. The bulk conductive layer may include aluminum (Al), copper (Cu), titanium (Ti), tantalum (Ta), tungsten (W), cobalt (Co), and/or other suitable materials.

Exemplary FinFET devices provided herein may be included in a microprocessor, a memory, and/or other integrated circuit device. In some embodiments, the FinFET devices may be a portion of an IC chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Additional features can be added to the FinFET devices by subsequent processing steps. For example, various vertical interconnect features such as contacts and/or vias, and/or horizontal interconnect features such as lines, and multilayer interconnect features such as metal layers can be formed over the ILD layer 1610.

Although not intended to be limiting, one or more embodiments of the present disclosure offer improvements for fabricating semiconductor devices, especially FinFET devices. For example, while loss of isolation features (e.g., isolation features 130) during fabrication of S/D features is commonly observed, the effects of such loss to subsequent fabrication steps vary depending upon the extent of the loss and/or the location of the loss, i.e., whether the loss occurs near PMOS S/D features or NMOS S/D features and the relative sizes of the loss in each region. Because the PMOS S/D features are generally smaller than the NMOS S/D features in size and in structural variations, allowing a greater extent of the loss to occur near the PMOS S/D features may help mitigate the overall loss of the isolation features and increasing processing window of the subsequent fabrication steps. The present disclosure provides embodiments to accomplish this by forming the PMOS S/D features prior to forming the NMOS S/D features.

Accordingly, the present disclosure provides many different embodiments of FinFET devices and methods of fabricating the same. In one aspect, the present disclosure provides a method of fabricating a FinFET device that includes providing a semiconductor substrate having a region for forming p-type metal-oxide-semiconductor (PMOS) devices and a region for forming n-type metal-oxide-semiconductor (NMOS) devices; forming a first fin structure in the PMOS region and a second fin structure in the NMOS region, the fin structures being separated by isolation features; recessing the first fin structure; epitaxially growing a first source/drain feature on the recessed first fin structure; subsequently, recessing the second fin structure; and epitaxially growing a second source/drain feature on the recesses second fin structure.

In some embodiments, the first fin structure includes one fin and the second fin structure includes two fins connected at bottom of the two fins. In further embodiments, the second source/drain feature in the NMOS region merges the fins of the second fin structure together.

In some embodiments, recessing the first fin structure includes forming a first hard mask layer over the PMOS region and the NMOS region; forming a first patterned etch mask over the NMOS region thereby exposing the PMOS region; and recessing the first fin structure, which in turn removes portions of the isolation features in the PMOS region such that the isolation features have a first depth with respect to a top surface of the isolation features prior to the recessing.

In some embodiments, epitaxially growing the first source/drain feature includes epitaxially growing a p-type epitaxial semiconductor structure on the recessed first fin structure; removing the first hard mask layer from the NMOS region; and forming a second hard mask layer over the PMOS region and the NMOS region.

In some embodiments, recessing the second fin structure includes forming a second patterned etch mask over the PMOS region to expose the NMOS region, and recessing the second fin structure, such that the recessing removes portions of the isolation features in the second region such that the isolation features have a second depth with respect to a top surface of the isolation features prior to the recessing. In a further embodiment, the second depth is less than the first depth. In some embodiments, recessing the second fin structure results in the second fin structure having a top surface above a top surface of the first fin structure.

In some embodiments, epitaxially growing the second source/drain feature includes epitaxially growing an n-type epitaxial semiconductor structure on the recessed second fin structure, and removing the second hard mask layer from the PMOS region.

In some embodiments, recessing the first fin structure and the recessing of the second fin structure forms a first recessed region and a second recessed region in the isolation features, respectively, the first recess region and the second recess region being formed between the first fin structure and the second fin structure. In further embodiments, a lateral distance of the first recessed region is greater than a lateral distance of the second recessed region.

In another aspect, the present disclosure provides a method of fabricating a FinFET device that includes providing a first fin structure on a semiconductor substrate for forming p-type metal-oxide-semiconductor (PMOS) devices and a second fin structure on the semiconductor substrate for forming n-type metal-oxide-semiconductor (NMOS) devices, the first fin structure and the second fin structure being separated by isolation features; forming a first hard mask layer over the first fin structure, the second fin structure, and the isolation features; removing a portion of the first fin structure to form a recessed first fin structure; forming a first source/drain feature on a top surface of the recessed first fin structure; removing the first hard mask layer from the second fin structure and the isolation features surrounding it; subsequently, forming a second hard mask layer over the first source/drain feature, the second fin structure, and the isolation features; subsequently, removing a portion of the second fin structure to form a recessed second fin structure; forming a second source/drain feature on a top surface of the recessed second fin structure; and subsequently, removing the second hard mask layer from the first fin structure and the isolation features surrounding it.

In some embodiments, the first fin structure comprises one fin and the second fin structure comprises two fins connected at bottom of the two fins. In a further embodiment, forming the second source/drain feature merges the two fins of the second fin structure. In yet another embodiment, a top surface of the recessed first fin structure is below a top surface of the recessed second fin structure. In some embodiments, removing the portion of the first fin structure comprises removing isolation features in the first region to form a first recessed region, wherein removing the portion of the second fin structure comprises removing isolation features in the second region to form a second recessed region, and wherein a lowest point of the first recessed region and the second recessed region is closer to the first source/drain feature than to the second source/drain feature. In some embodiments, removing the portion of the first fin structure comprises removing isolation features in the first region to form a third recessed region, and removing the portion of the second fin structure comprises removing isolation features in the second region to form a fourth recessed region. In further embodiments, the third recessed region and the fourth recessed region are formed in a space between the first source/drain feature and the second source/drain feature and are separated by an island of the isolation features.

In yet another aspect, the present disclosure provides an exemplary FinFET device that includes a semiconductor substrate having a region for forming p-type metal-oxide-semiconductor (PMOS) devices and a region for forming n-type metal-oxide-semiconductor (NMOS) devices; a source/drain feature over a fin structure in the PMOS region, the source/drain feature comprising a p-type epitaxial structure; another source/drain feature over a fin structure in the NMOS region, the source/drain feature comprising an n-type source/drain structure; and isolation features between the first source/drain feature and the second source/drain feature. In some embodiments, the isolation features includes a first portion adjacent to the first source/drain feature, a second recessed portion adjacent to the second source/drain feature, and a third portion disposed between the first portion and the second portion. In further embodiments, a lateral distance of the first portion is greater than a lateral distance of the second portion.

In some embodiments, the fin structure in the PMOS region comprises one fin and the fin structure in the NMOS region comprises two fins. In a further embodiment, the source/drain features formed in the NMOS region merges the fins of the fin structure in the NMOS region together. In some embodiments, a distance between a lowest point and a highest point of the first portion of the isolation features is greater than a distance between a lowest point and a highest point of the second portion of the isolation features.

In some embodiments, a ratio of the lateral distance of the first portion of the isolation features to the lateral distance of the second portion of the isolation features is between about 1:5 and about 3:5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor substrate having a first region for forming p-type metal-oxide-semiconductor (PMOS) devices and a second region for forming n-type metal-oxide-semiconductor (NMOS) devices;
forming a first fin structure in the first region and a second fin structure in the second region, wherein the first fin structure and the second fin structure are separated by isolation features;
recessing the first fin structure, wherein recessing the first fin structure forms a first recessed region in the isolation features;
epitaxially growing a p-type source/drain feature on the recessed first fin structure;
subsequent to epitaxially growing the p-type source/drain feature, recessing the second fin structure, wherein recessing the second fin structure forms a second recessed region in the isolation features, such that an island is formed in the isolation features between the first and the second recessed regions; and
epitaxially growing an n-type source/drain feature on the recessed second fin structure.

2. The method of claim 1, wherein the first fin structure includes one fin and the second fin structure includes two fins connected at bottom of the two fins, and wherein the n-type source/drain feature in the second region merges the fins of the second fin structure together.

3. The method of claim 1, wherein recessing the first fin structure comprises:
forming a first hard mask layer over the first region and the second region;
forming a first patterned etch mask over the second region thereby exposing the first region; and
recessing the first fin structure, wherein the first recessed region has a first depth with respect to a top surface of the island.

4. The method of claim 3, wherein epitaxially growing the p-type source/drain feature further comprises:
subsequent to epitaxially growing the p-type source/drain feature, removing the first hard mask layer from the second region; and
subsequent to removing the first hard mask layer, forming a second hard mask layer over the first region and the second region.

5. The method of claim 4, wherein recessing the second fin structure comprises:
subsequent to forming the second hard mask layer, forming a second patterned etch mask over the first region thereby exposing the second region; and
recessing the second fin structure, wherein the second recessed region has a second depth with respect to the top surface of the island, and wherein the second depth is less than the first depth.

6. The method of claim 5, wherein epitaxially growing the n-type source/drain feature further comprises:
subsequent to epitaxially growing the n-type source/drain feature, removing the second hard mask layer from the first region.

7. The method of claim 1, wherein the first recessed region and the second recessed region are formed between the first fin structure and the second fin structure, and wherein a width of the first recessed region is greater than a width of the second recessed region.

8. The method of claim 1, wherein recessing the second fin structure results in the second fin structure having a top surface above a top surface of the first fin structure.

9. The method of claim 1, wherein recessing the second fin structure results in a width of the first recessed region being greater than a width of the island.

10. A method, comprising:
providing a first fin structure on a semiconductor substrate in a first region for forming p-type metal-oxide-semiconductor (PMOS) devices and a second fin structure on the semiconductor substrate in a second region for forming n-type metal-oxide-semiconductor (NMOS) devices, wherein the first fin structure and the second fin structure are separated by isolation features;
forming a first hard mask layer over the first fin structure, the second fin structure, and the isolation features;
forming a first patterned etch mask layer over the second region thereby exposing the first region;
removing a portion of the first fin structure to form a recessed first fin structure;
forming a first source/drain feature on a top surface of the recessed first fin structure;
removing the first hard mask layer from the second fin structure and the isolation features surrounding the second fin structure;
subsequent to removing the first hard mask layer, forming a second hard mask layer over the first source/drain feature, the second fin structure, and the isolation features;
subsequent to forming the second hard mask layer, forming a second patterned etch mask over the first region thereby exposing the second region;
removing a portion of the second fin structure to form a recessed second fin structure;
forming a second source/drain feature on a top surface of the recessed second fin structure; and
subsequent to forming the second source/drain feature, removing the second hard mask layer from the first fin structure and from the isolation features surrounding the first fin structure.

11. The method of claim 10, wherein the first fin structure comprises one fin and the second fin structure comprises two fins connected at bottom of the two fins.

12. The method of claim 11, wherein forming the second source/drain feature merges the two fins of the second fin structure.

13. The method of claim 11, wherein a top surface of the recessed first fin structure is below a top surface of the recessed second fin structure.

14. The method of claim 10, wherein removing the portion of the first fin structure comprises removing isolation features in the first region to form a first recessed region, wherein removing the portion of the second fin structure comprises removing isolation features in the second region to form a second recessed region, and wherein a lowest point of the first recessed region and the second recessed region is closer to the first source/drain feature than to the second source/drain feature.

15. The method of claim 14, wherein removing the portion of the first fin structure comprises removing isolation features in the first region to form a third recessed region, wherein removing the portion of the second fin structure comprises removing isolation features in the second region to form a fourth recessed region, and wherein the third recessed region and the fourth recessed region are formed in a space between the first source/drain feature and the second source/drain feature and are separated by an island of the isolation features.

16. The method of claim 15, wherein a lateral distance of the third recessed region is greater than a lateral distance of fourth recessed region.

17. A method, comprising:
providing a semiconductor substrate;
forming a first fin structure and a second fin structure on the semiconductor substrate, wherein the first and the second fin structures are separated by isolation features;
recessing the first fin structure, wherein recessing the first fin structure forms a first recessed region in the isolation features;
forming a first source/drain feature on the recessed first fin structure, wherein the first source/drain feature includes a p-type epitaxial semiconductor structure;
subsequent to forming the first source/drain feature, recessing the second fin structure wherein recessing the second fin structure forms a second recessed region in the isolation features, and wherein a lowest point of the first recessed region is disposed below a lowest point of the second recessed region; and
forming a second source/drain feature on the recessed second fin structure, wherein the second source/drain feature includes an n-type epitaxial semiconductor structure.

18. The method of claim 17, wherein recessing the second fin structure results in the recessed second fin structure having a top surface above a top surface of the recessed first fin structure.

19. The method of claim 17, wherein the second fin structure includes a plurality of fins, and wherein forming the second source/drain feature on the recessed second fin structure includes growing the n-type epitaxial semiconductor structure on the plurality of fins of the recessed second fin structure.

20. The method of claim 17, further comprising depositing a contact etch-stop layer over the first and second source/drain features.

* * * * *